United States Patent
Lee et al.

(10) Patent No.: US 6,243,298 B1
(45) Date of Patent: Jun. 5, 2001

(54) NON-VOLATILE MEMORY CELL CAPABLE OF BEING PROGRAMMED AND ERASED THROUGH SUBSTANTIALLY SEPARATE AREAS OF ONE OF ITS DRAIN-SIDE AND SOURCE-SIDE REGIONS

(75) Inventors: Hsiao-Lun Lee, Sunnyvale; Eung Joon Park, Fremont; Ali Pourkeramati, Redwood City, all of CA (US)

(73) Assignee: Azalea Microelectronics Corporation, Santa Clara, CA (US)

( * ) Notice: Subject to any disclaimer, the term of this patent is extended or adjusted under 35 U.S.C. 154(b) by 0 days.

(21) Appl. No.: 09/503,982

(22) Filed: Feb. 14, 2000

Related U.S. Application Data

(63) Continuation-in-part of application No. 09/433,245, filed on Nov. 3, 1999.
(60) Provisional application No. 60/171,740, filed on Dec. 22, 1999, and provisional application No. 60/149,767, filed on Aug. 19, 1999.

(51) Int. Cl.[7] ..................................................... G11C 16/04
(52) U.S. Cl. .............................. 365/185.28; 365/185.24; 365/185.26
(58) Field of Search ....................... 365/185.28, 185.24, 365/185.26, 185.1, 185.01, 185.13

(56) References Cited

U.S. PATENT DOCUMENTS

| | | | |
|---|---|---|---|
| 4,698,787 | 10/1987 | Mukherjee et al. | 365/185 |
| 4,758,986 | 7/1988 | Kuo | 365/185 |
| 4,884,239 | 11/1989 | Ono et al. | 365/185 |

(List continued on next page.)

FOREIGN PATENT DOCUMENTS 10-241381  9/1998  (JP).

OTHER PUBLICATIONS

Haddad et al., "Degradations Due to Hole Trapping in Flash Memory Cells," *IEEE Electron Device Letters* (1989) 10:117–119.

Kim et al., "A Novel 4.5F$^2$NOR Cell Technology With Lightly Doped Source (LDS) Junction for High Density Flash Memories," *IEDM* (1998) pp. 979–982.

Bude et al., "EEPROM/Flash Sub 3.0V Drain–Source Bias Hot Carrier Writing," *IEDM* (1995) pp. 989–991.

(List continued on next page.)

*Primary Examiner*—David Nelms
*Assistant Examiner*—Thong Le
(74) *Attorney, Agent, or Firm*—Townsend and Townsend and Crew LLP

(57) ABSTRACT

In accordance with the present invention, a low VCC operational non-volatile memory cell includes a drain region and a source region separated by a channel region. A tunneling dielectric layer extends over the channel region and a portion of the drain and source regions. A floating gate extends over the tunneling dielectric. An insulating layer extends over the floating gate, and a control gate extends over the insulating layer. The channel region is implanted with a relatively low dosage of channel threshold enhancement impurities or halo impurities to obtain a low initial Vt in the range of, for example, 0V to 0.8V. The low initial Vt enables a low program Vt target ,e.g., 4V or less, which in turn enables the use of double-diffused N+, N– drain or source junctions with the N+ region being inside the N– region. The memory cell is programmed through hot electron injection from a channel region near the N– region to the floating gate, and is erased through Fowler-Nordheim tunneling of electrons from the floating gate to an area of the N+ region near the N– region. Thus, the N– region separates the erase area in the N+ region from the program area in the channel region.

39 Claims, 3 Drawing Sheets

U.S. PATENT DOCUMENTS

| | | | |
|---|---|---|---|
| 4,996,571 | 2/1991 | Kume et al. | 357/23.5 |
| 5,077,691 | 12/1991 | Haddad et al. | 365/218 |
| 5,172,338 | 12/1992 | Mehrotra et al. | 365/185 |
| 5,340,760 * | 8/1994 | Komori et al. | 437/43 |
| 5,357,465 | 10/1994 | Challa | 365/185 |
| 5,638,327 | 6/1997 | Dallabora et al. | 365/185.33 |
| 5,686,333 * | 11/1997 | Sato | 437/43 |
| 5,747,849 | 5/1998 | Kuroda et al. | 257/321 |
| 5,793,673 | 8/1998 | Pio et al. | 365/185.01 |
| 5,796,657 | 8/1998 | Lee et al. | 365/185.11 |
| 5,850,092 | 12/1998 | Cappelletti | 257/321 |
| 5,912,844 | 6/1999 | Chen et al. | 365/185.28 |
| 5,917,750 * | 6/1999 | Miyakawa et al. | 365/185.04 |
| 5,920,503 | 7/1999 | Lee et al. | 365/185.11 |
| 5,945,717 | 8/1999 | Chevallier | 257/390 |
| 5,949,718 | 9/1999 | Randolph et al. | 365/185.33 |
| 5,953,255 | 9/1999 | Lee | 365/185.29 |
| 6,049,482 * | 4/2000 | Aritome et al. | 365/185.24 |

OTHER PUBLICATIONS

Koyanagi et al., "Optimum Design of $N^+ - n^-$ Double–Diffusion Drain MOSFET to Reduce Hot–Carrier Emission," *IEEE Transactions on Electron Devices* (1985) ED–32:562–570.

Kume et al., "A 1.28$\mu m^2$ Contactless Memory Cell Technology for a 3V–Only 64Mbit EEPROM," *IEDM* (1992) pp. 991–993.

* cited by examiner

NON-VOLATILE MEMORY CELL CAPABLE OF BEING PROGRAMMED AND ERASED THROUGH SUBSTANTIALLY SEPARATE AREAS OF ONE OF ITS DRAIN-SIDE AND SOURCE-SIDE REGIONS

CROSS-REFERENCES TO RELATED APPLICATIONS

This application derives priority from application Ser. No. 60/171,740, filed Dec. 22, 1999. This application is also a Continuation-In-Part of application Ser. No. 09/433,245, filed Nov. 3, 1999, which is a continuation of application Ser. No. 60/149,767, filed Aug. 19, 1999.

BACKGROUND OF THE INVENTION

The present invention relates in general to semiconductor memory devices, and in particular to a non-volatile memory cell capable of being programmed and erased through substantially separate areas of one of its drain-side and source-side regions.

Non-volatile semiconductor memory devices retain stored information even when the applied power is removed from the devices. There are various types of non-volatile semiconductor memory devices. These include read-only-memory (ROM) wherein by implanting P-type dopants such as Boron or N-type dopants such as Phosphorous into the channel region of the memory cell the state of the cell is permanently programmed to "0" or "1". Another type of non-volatile memory uses programmable fuses wherein an electrical signal is applied to the fuse to blow the fuse resulting in an open circuit, or the fuse is kept intact for a short. There is also erasable programmable read-only-memory (EPROM) that typically uses channel hot electron (CHE) injection into a floating gate to change the threshold voltage of the memory cell to a high Vt state, and ultra-violate (UV) light to erase the cell back to its original low Vt state. Electrically erasable programmable read-only-memory (EEPROM) uses the so called Fowler-Nordheim (FN) tunneling of electrons into or out of the floating gate under high electric field to program or erase the cell. Flash memory is yet another type of non-volatile memory. Several different types of flash memory cell structures have been developed, including split-gate source-side injection cell, triple Poly Poly-Poly erase cell , and stack gate cell.

FIG. 1 shows a prior art n-channel stack gate flash memory cell 9. Memory cell 9 includes N+ source 12 and drain 13 regions spaced apart in a P-type silicon substrate 10 to form a channel region 11. Source region 12 may be formed as a N+,N− double diffused junction for improved cell reliability, while drain region 13 remains N+ for maximum hot electron injection efficiency. A P+ region 20, typically created by a halo implant, may be formed adjacent to drain region 13 to improve hot electron generation. A floating gate 15 of Polycrystalline silicon material is laid on top of a tunneling dielectric 14, e.g. silicon dioxide, which overlaps the channel region 11 and parts of the source 12 and drain 13 regions. Stacked on top of floating gate 15 is a gate 19 of polycrystalline material upon an insulation dielectric combination of oxide 18, nitride 17 and oxide 16 films.

FIG. 2 is the circuit symbol representing the cell structure described in FIG. 1. There are several ways to program and erase the cell. To program stack gate cell 9, one approach uses channel hot electron injection by applying a high voltage (e.g. 9V) to gate 19, 0V to substrate 10 and source 12, and 5V to drain 13. Maintaining this biasing for about 2 $\mu$s is programs the threshold voltage of the cell from an initial state of Vt=1.4V to a program state of Vt=5.8V as described in a paper by Watanabe, H., et al., "Novel 0.44 $\mu m^2$ Ti-salicide STI Cell Technology for High-Density NOR Flash Memories and High Performance Embedded application" IEEE, IEDM Tech. Dig., 1998, pp. 975–978. Another approach uses channel initiated secondary electron injection (CISEI) by applying Vgs=Vds=−Vbs=3V for 1 ms during which the threshold voltage increases by 1.5 V, as described in a paper by Bude, J. D. et al., "EEPROM/Flash Sub 3.0V Drain-Source Bias Hot Carrier Writing" IEEE, IEDM Tech. Dig., 1995, pp. 989–991.

To erase stack gate cell 9, one approach uses the so called source-side erase by applying 12V to source 12 and 0V to gate 19 and substrate 10, and floating drain 13. In roughly 500 ms, the cell is erased from a high threshold voltage back to low threshold voltage, e.g., from 8V to 2V. In another approach, commonly referred to as negative gate source-side erase, 4V is applied to source 12 and −8V to gate 19, 0V to substrate 10, and drain 13 is left floating. In yet another approach −10V is applied to gate 19 and 6V to substrate 10 and the drain 13 and source 12 are left floating as described in a paper by Kim, J., et al., "A novel $4.6F^2$ NOR Cell Technology with Lightly Doped Source (LDS) Junction For High Density Flash Memories" IEEE, IEDM Tech. Dig., 1998, pp. 979–982. Erase from the drain side causes hole injection into oxide which degrades programmability of the cell as well as the cycling characteristics of the cell, as described in a paper by Haddad, S., et al., IEEE Electron Device Letters, Vol., 10, No. 3, March 1989, pp. 117–119.

Conventionally, the initial cell threshold voltage Vt (i.e., the Vt after manufacturing of the memory and prior to the first program or erase operation), defined as the gate voltage of the cell at a certain drain current level (e.g., 1 nA), is set to a target level (e.g., 1.4V to 2V) by either a channel threshold enhancement implant or through a halo implant. However, as technology shrinks to smaller geometries and lower operating voltages, such high initial Vt's as 1.4V to 2V become a barrier to low VCC design. This is because at low VCC's, no cell current can be detected. Further, as described in paper of Bude, J. D. et al., "EEPROM/Flash Sub 3.0V Drain-Source Bias Hot Carrier Writing" IEEE, IEDM Tech. Dig., 1995, pp. 989–991 and in U.S. Pat. Bude, 5,659,504, it is possible to use the cell for low VCC operation, but the programming time is in the mili-second range. This is at least two orders of magnitude higher than CHEI programming time.

Thus, it is advantageous to lower the initial threshold voltage Vt of the cell. However, lower initial threshold voltage can lead to subthreshold leakage. FIG. 3 is used to illustrate the adverse effect of subthreshold leakage. In FIG. 3, memory cells are arranged in an array of plurality of rows of wordlines, WL0, WL1, . . . WL($2^m$−1) and columns of bitlines, BL0, BL1, BL2, . . . BL($2^n$−1), with all sourcelines connected together and a shared substrate as shown in FIG. 3. In low Vcc operations (e.g., 3V), supplying a drain voltage of, for example 4V, to a selected bitline requires a charge pump circuit. Because of a charge pump's limited current supply capability and the low Vt of unprogrammed cells in the array of FIG. 3, subthreshold leakage through the unselected unprogrammed cells connected to the selected bit line causes the drain voltage applied to the selected bitline to be lowered. This results in longer programming time.

In the prior art array structures such as the one shown in FIG. 3, erase operation involves either source-side erase or negative gate erase. This type of erase operation erases either an entire block of cells that share the same sourceline, or specific cells that share the same row. In these schemes byte erase becomes impossible, a drawback which further limits the applications of the device.

There is therefore a need for an improved low VCC operational non-volatile memory cell.

SUMMARY OF THE INVENTION

In accordance with the present invention, a low VCC operational non-volatile memory cell includes a drain region and a source region separated by a channel region. A tunneling dielectric layer extends over the channel region and a portion of the drain and source regions. A floating gate extends over the tunneling dielectric. An insulating layer extends over the floating gate, and a control gate extends over the insulating layer.

In one embodiment, the channel region is implanted with a relatively low dosage of channel threshold enhancement impurities or halo impurities to obtain a low initial threshold voltage in the range of, for example, 0V to 0.8V. The low initial threshold voltage allows the target program threshold voltage to also be lower such that a programming margin of, e.g., 1V to 1.5V over VCC is sufficient. For example, for VCC=2.5V, the target program threshold voltage can be set to Vt=4V or less. The low program Vt requirements enable the use of double-diffused N+, N− drain junction with the N+ region inside the N− region.

In another embodiment, the memory cell is programmed through hot electron injection from a channel region near the drain N− region to the floating gate, and is erased through Fowler-Nordheim tunneling of electrons from the floating gate to an area of the drain N+ region near the N− region. Thus, the drain N− region separates the erase area in the drain N+ region from the program area in the channel region. The drain N− region significantly reduces hole injection into the tunnel oxide during program and erase operations.

In another embodiment, a plurality of such cells are arranged in a plurality of rows and columns so that the gates of the memory cells in each row are connected together forming a wordline parallel to the rows of cells, the drains of the memory cells in each column are connected together forming a bitline parallel to the columns of cells, and the sources of the memory cells of every two adjacent rows of cells are connected together forming a source line parallel to the rows of cells.

In one embodiment, sourcelines are connected to sourceline decoders for selection. The selected sourceline is biased to 0V and non-selected sourcelines either float or are biased to a voltage in the range of, for example, 0.3V to 1.2V, to prevent subthreshold leakage current from the selected bitlines to non-selected source lines.

In yet another embodiment, the cells along each row are selectively erasable by applying a positive voltage, e.g., 4V, to the selected bitlines, and a negative gate voltage, e.g., −8V, to the selected wordline.

The following detailed description and the accompanying drawings provide a better understanding of the nature and advantages of the present invention.

DESCRIPTION OF THE SPECIFIC EMBODIMENTS

Figure 1:
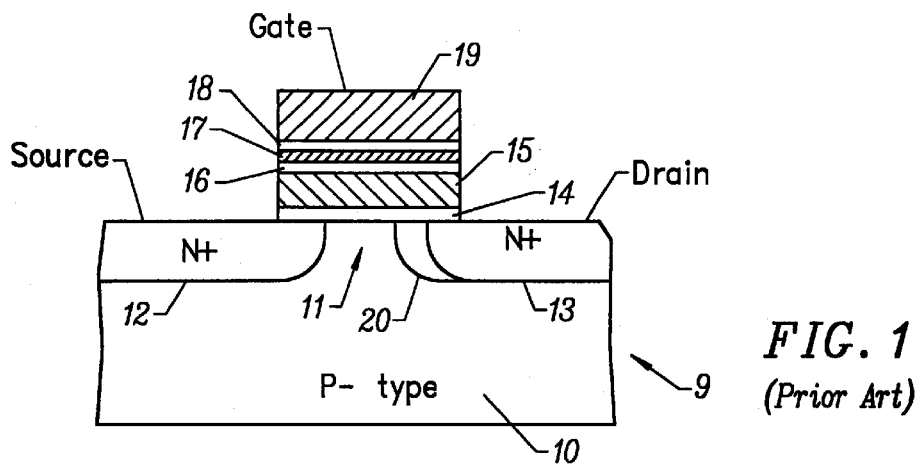
FIG. 1 is a cross sectional view of a flash memory cell structure of prior art.
Figure 2:
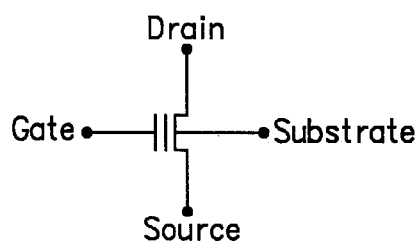
FIG. 2 is a circuit symbol of the FIG. 1 flash memory cell.
Figure 3:
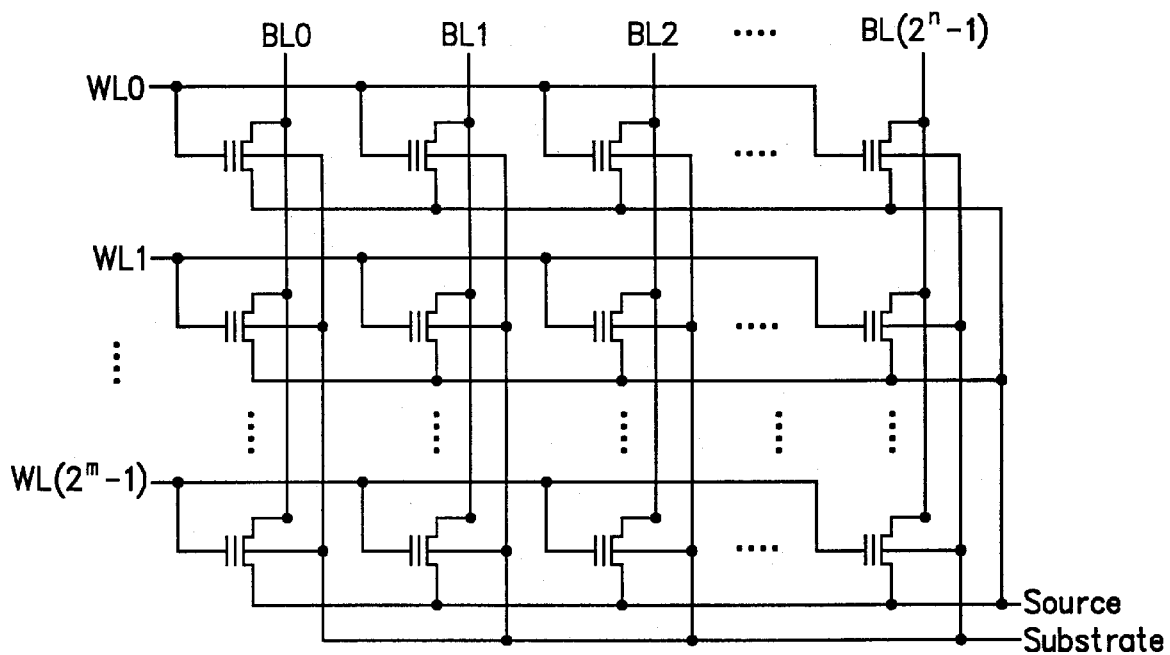
FIG. 3 a schematic of a prior art array of memory cells.
Figure 4:
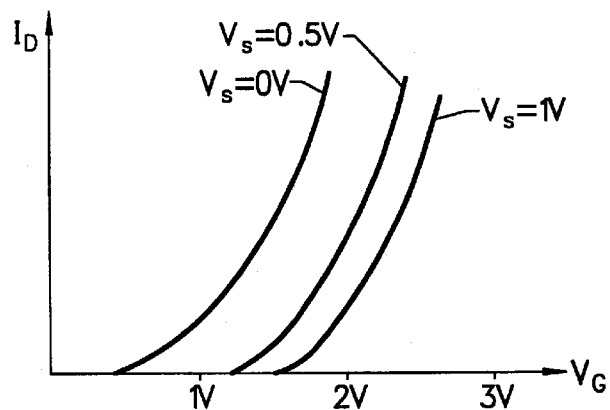
FIG. 4 illustrates drain current versus gate voltage with source bias as a parameter for a MOS transistor.

FIG. 4 shows the N-channel MOS transistor characteristics illustrating drain current versus gate voltage with source bias as a parameter. From the graph, it can be seen that it is advantageous to be able to selectively bias the MOS transistor's source voltage to obtain the desired threshold voltage. This is in contrast to achieving the desired threshold voltage by hard implant of ions into the MOS channel region. For low VCC operations, the threshold voltage of the cell is required to be low such that the gate overdrive (Vg−Vt) results in higher drain current.

In accordance with the present invention, a cell with a low initial threshold voltage Vt is obtained by reducing the dosage of (or eliminating) the channel enhancement implant or halo implant during manufacturing. However, as described above, such low initial threshold voltage results in subthreshold leakage current which in turn results in faulty programming and erase.

Figure 5:
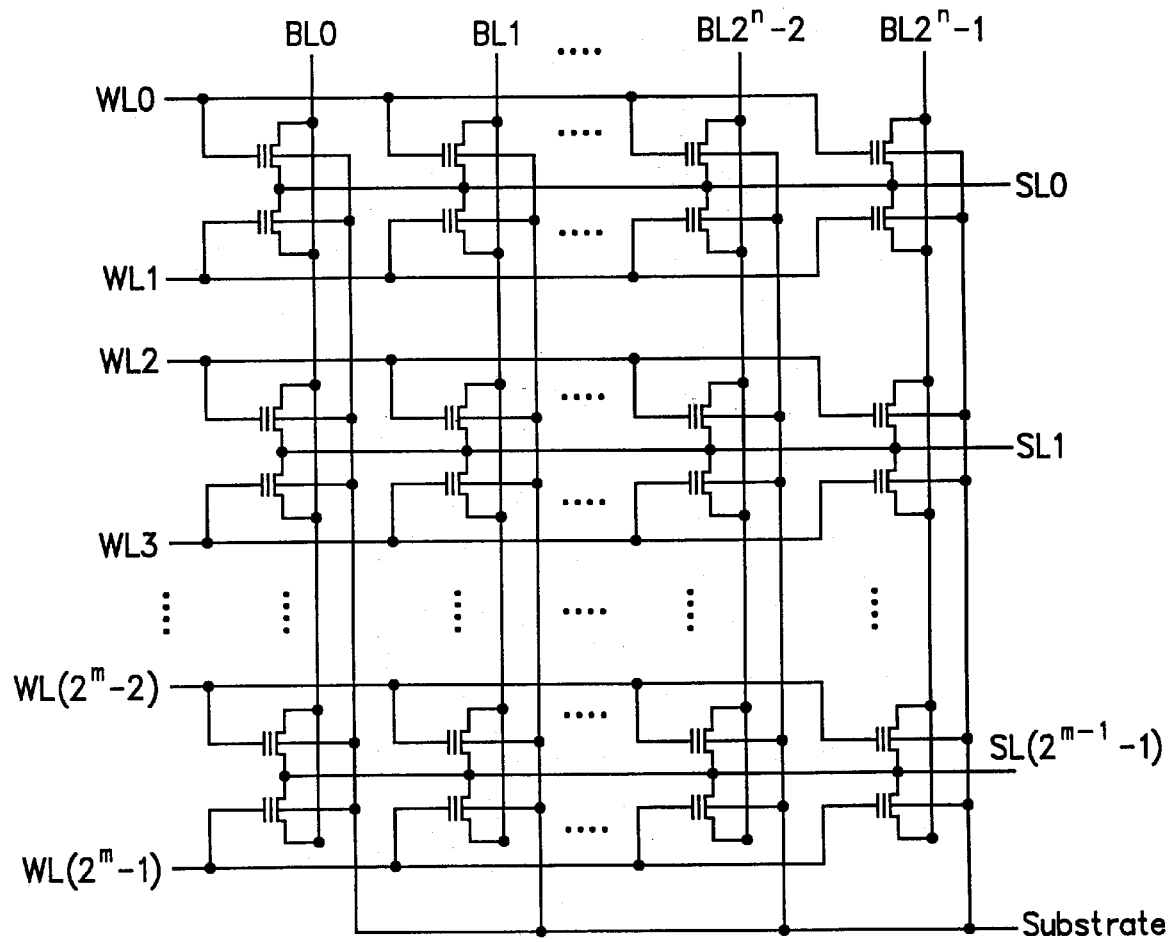
FIG. 5 shows a memory array configuration according to one embodiment of the present invention.

FIG. 5 shows a memory array configuration in accordance with one embodiment of the present invention. In the FIG. 5 array, memory cells having low initial Vt are arranged in rows and columns so that the gates of the memory cells in each row are connected together forming a wordline, e.g., WL1, parallel to the rows of cells, the drains of the memory cells in each column are connected together forming a bitline, e.g., BL1, parallel to the columns of cells, and the sources of the memory cells of every two adjacent rows of cells are connected together forming a source line, e.g., SL1, parallel to the rows of cells.

In one embodiment, the subthreshold leakage is eliminated by connecting sourcelines SL0 to SL ($2^{m-1}-1$) to sourceline decoders (not shown) for selection. An exemplary sourceline biasing during programming and erase for such array is as follows: the selected sourceline is set to 0V and non-selected sourcelines either float or are preset to a voltage in the range of, for example, 0.3V to 1.2V, so that the unprogram Vt of cells connected to nonselected sourcelines is higher, e.g., is in the range of 1.4V to 2V, than those connected to the selected sourceline. The higher unprogram Vt of cells connected to the unselected sourcelines ensures that the unselected cells remain completely off, thus eliminating subthreshold leakage current through these cells.

In another embodiment, the sourcelines are all tied together to a global sourceline. In this embodiment, the subthreshold leakage is eliminated by biasing the global sourceline to a voltage in the range of 0.3V to 1.2V during programming and erase. This ensures that all cells connected to the deselected wordlines are off. Note that this embodiment requires that the voltages applied to the selected word line and bitline be raised by an amount equal to the voltage applied to the global sourceline.

In yet another embodiment, the subthreshold leakage is eliminated by lowering the voltage applied to the unselected wordlines from the conventional 0V to a negative voltage, e.g., −0.5V. The negative voltage ensures that the unselected cells remain completely off during programming and erase. The magnitude of the negative voltage is primarily determined by the extent of cell's drain to floating gate capacitive coupling and the cell's unprogram threshold voltage, and thus may vary depending on the technology.

With a lower initial threshold voltage than conventional cells, a lower wordline voltage can be used to sense the state of the memory cells. This allows the required program threshold voltage to be lowered. A lower program threshold voltage requirement in turn allows the use of double-diffused drain junction with N+, N− structure. As described by Koyanagi, M., et al., in "Optimum Design of n+-n− Double-Diffused Drain MOSFET to Reduce Hot-Carrier Emission" IEEE, Transactions on Electron Devices, Vol. ED-32, No. 3, March 1985, pp. 562–570, it is desirable to introduce an N− diffusion region to reduce the electric field near the drain junction. The N− diffusion region is formed by implanting impurities at an implant energy higher than the memory cell source/drain implant energy, and at a dose of an order or two (or more) lower than the memory cell source/drain implant dose. In the same paper by Koyanagi, et al., it is shown that it is possible to change the lateral electric field (electron flow from source to drain) without affecting the vertical field which affects the hot electron injection.

Figure 6:
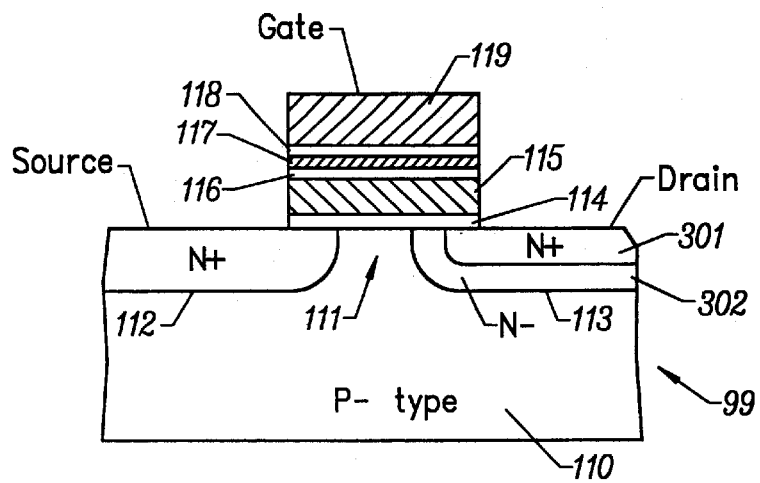
FIG. 6 is a cross sectional view of the flash memory cell according to one embodiment of the present invention.

FIG. 6 shows a cross sectional view of an exemplary memory cell 99 according to the present invention. While in a preferred embodiment memory cell 99 is employed as a flash memory cell, it can also be utilized in other types of non-volatile memories such as EPROMS. Memory cell 99 includes source region 112 and drain region 113 spaced apart in a P-type silicon substrate 110 to form channel region 111. Source region 112 may be formed as a N+, N− double diffused junction or just a N+ junction, while drain region 113 is a double diffused N+ 301, N− 302 junction. A floating gate 115 of Polycrystalline silicon material is formed over a tunneling dielectric 114, e.g. silicon dioxide, which overlaps the channel region and parts of the source and drain regions. Stacked on top of floating gate 115 is a gate 119 of polycrystalline material upon an insulation dielectric combination of oxide 118, nitride 117 and oxide 116 films.

A low initial Vt is achieved by implanting the channel region 111 with Boron species at an energy in the range of 15–40 Kev and a dosage in the range of 1e12 to 5e13 cm$^{-2}$ while covering the non-implanted area by photoresist. The drain region 113 is formed by using a photoresist layer to cover the non-implanted area and leaving the drain region open to receive multiple implants. Initially, a N+ implant of Arsenic species at an energy in the range of 30–70 Kev, a dosage in the range of 6e14 to 6e15 cm$^{-2}$, and an angle of 7 to 35 degree off from vertical axis of the wafer plane is carried out. Next, a N− implant of Arsenic or Phosphorous species at an energy in the range of 30–120 Kev, a dosage in the range of 1e13 to 4e14 cm$^{-2}$, and an angle in the range of 7 to 35 degree off from vertical axis of the wafer plane is carried out. Finally, an optional P+ implant with species of Boron at an energy in the range of 30–80 Kev, a dosage in the range of 1e12 to 8e13 cm$^{-2}$, and an angle in the range of 7 to 35 degree off from the vertical axis of the wafer plane may be carried out to further increase hot electron injection.

Note that the N+ source diffusion can be formed either at the same time as the drain diffusion formation, or at the same time as the periphery source/drain region formation. The latter alternative results in a smaller cell size without requiring additional masking steps.

Figure 7:
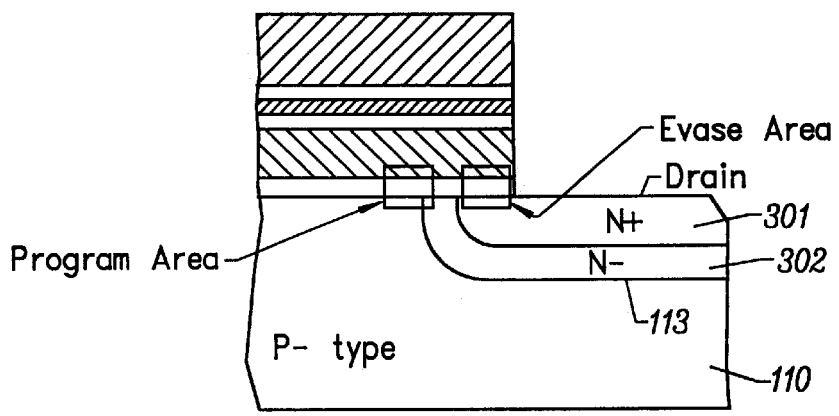
FIG. 7 is an enlarged view of the drain junction of the memory cell of the present invention indicating separate program area and erase area.
Figure 8:
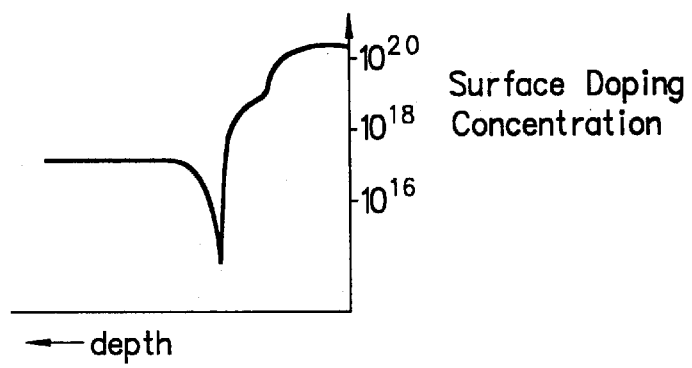
FIG. 8 is an example of surface doping concentration profile along the oxide-silicon surface of N+, N− and channel regions according to the present invention.

An enlarged view of the drain junction 113 is shown in FIG. 7, and an example of the surface doping concentration profile along the oxide-silicon surface of N+ 301, N− 302, and channel 111 regions is shown in FIG. 8. It is shown that N− region 302 has a doping concentration which is at least an order of magnitude less than the doping concentration of N+ region 301. The N− region 302 of the drain junction 113 serves to effectively separate erase region from the program region. Hot electron injection occurs near the drain pinch-off point, labeled "program area" in FIG. 7. When programming voltages of, for example, Vg=10V, Vd=4V and Vs=Vsub=0V are applied, hot electrons inject in the "program area" from the channel region to the floating gate. Vg, Vd, Vs, and Vsub represent the voltages at gate 119, drain 113, source 112 and substrate 110, respectively.

During erase operation, Vg is set to, for example, −10V which causes an inversion layer to be formed in the N− region 302, effectively converting the surface of N− region 302 into P-type (same as the substrate). Therefore, during erase operation, electrons primarily tunnel through the portion of N+ region 301 labeled "erase area" in FIG. 7, where the maximum electric field exists. Due to the N− region 302, drain junction 113 produces much less hole injection during erase operations.

Table 1 below provides an example of various array operation voltages for the selected wordline (WL), bitline (BL), and sourceline (SL):

TABLE 1

|  | WL | BL | SL |
|---|---|---|---|
| Program | 7 V to 10 V | 4 V to 6 V | 0 V/0.5 V |
| Erase | −7 V to −10 V | 3 V to 5 V | Float/0.5 V |
| Read | 1 V to 2.5 V | 0.7 V to 1.2 V | 0 V/0.5 V |

Table 2 below provides an example of various array operation voltages for the non-selected wordlines (WL), bitlines (BL), and sourcelines (SL):

TABLE 2

|  | WL | BL | SL |
|---|---|---|---|
| Program | 0 V/−0.5 ± Δ | Float | 0 V/0.5 V/Float |
| Erase | 0 V/−0.5 ± Δ | Float | 0.5 V/Float |
| Read | 0 V | Float | 0.5 V/Float |

The substrate is biased to 0V during all operations. It is to be understood that the above voltage levels are used herein for illustrative purposes only. From the tables it is clear that CHEI mechanism is used for programming and FN mechanism is used for erase. Since erase is from the drain side, it provides means to selectively choose the number of bitlines to be erased. The invention allows, for example, 8 bits, 16 bits, or all bits on the same wordline to be erased at the same time.

While the above is a complete description of the preferred embodiment of the present invention, it is possible to use various alternatives, modifications and equivalents. For example, all voltage levels indicated for various biasing conditions, the dosage, energy, and angle indicated for implanting of different species are used herein for illustrative purposes only, and that they may vary depending on the process and circuit requirements. Further, the circuit diagrams are for depiction of the various circuit elements and do not necessarily limit the layout or other architectural aspects of the array. Therefore, the scope of the present invention should be determined not with reference to the above description but should, instead, be determined with reference to the appended claim, along with their full scope of equivalents.

What is claimed is:

1. A semiconductor memory cell, comprising:
a source region and a drain region of first conductivity type in a body region of a second conductivity type opposite the first conductivity type, the source and drain regions being spaced apart to form a channel region therebetween, one of the source and drain regions comprising a first diffusion region and a second diffusion region both of the first conductivity type, the second diffusion region being in the first diffusion region, the first diffusion region having a doping concentration lower than a doping concentration of the second diffusion region;
a tunneling dielectric layer over the channel region and partially overlapping the source and drain regions;
a floating gate of polycrystalline silicon material over the tunneling dielectric;
an insulating dielectric material over the floating gate; and
a control gate of polycrystalline silicon material over the insulating dielectric material;
wherein a first threshold voltage of the memory cell is increased by inducing hot electron injection into the floating gate from a portion of the channel region closer to said one of the source and drain regions having a first and second diffusion regions than the other of said one of the source and drain regions, and a second threshold of the memory cell is reduced by inducing Fowler-Nordheim tunneling of electrons from the floating gate to the second diffusion region.

2. The memory cell of claim 1, wherein the channel region is implanted with impurities such that an initial threshold voltage of the cell is in the range of 0V to 0.8V.

3. The memory cell of claim 1, wherein the channel region has halo impurities such that the threshold voltage of the cell is in the range of 0V to 0.8V.

4. The memory cell of claim 1 wherein the first and second diffusion regions form a graded junction.

5. The memory cell of claim 1 wherein the first diffusion region is N− and the second diffusion region is N+.

6. The memory cell of claim 5 wherein a doping concentration of the first region is at least an order of magnitude less than a doping concentration of the second region.

7. The memory cell of claim 1 wherein the source region is a graded junction or a N+ diffusion region.

8. The memory cell of claim 1 wherein the memory cell is a flash EPROM cell.

9. The memory cell of claim 1 further comprising a third region of the second conductivity type adjacent to the first diffusion region between the first diffusion region and the channel region.

10. The memory cell of claim 9 wherein the third region is a P+ region.

11. The memory cell of claim 1 wherein the insulating dielectric material comprises a stack of Oxide-Nitride-Oxide films.

12. A memory array comprising:
a plurality of non-volatile memory cells, each memory cell having a gate, a drain, and a source, the memory cells being arranged to form rows and columns of cells, the gates of the memory cells in each row being connected together to form a wordline extending parallel to the rows of cells, the drains of the memory cells in each column being connected together to form a bitline extending parallel to the columns of cells, and the sources of the memory cells in every two adjacent rows of cells being connected together to form a sourceline extending parallel to the rows of cells.

13. The memory array of claim 12 further comprising a decoder configured to select one or more of the sourcelines.

14. The memory array of claim 13 wherein during programming and erase operations, a selected sourceline is biased to 0V, and all nonselected sourcelines float or are biased to a first voltage greater than 0V.

15. The memory array of claim 14 wherein the first voltage is selected from a range of 0.3V to 1.0V.

16. The memory array of claim 12 further comprising a bitline decoder configured to provide an erase voltage to one or more selected bitlines for selectively erasing memory cells along each row.

17. The memory array of claim 12 wherein during programming and erase operations, non-selected wordlines are biased to a negative voltage.

18. The memory array of claim 12 wherein all the sourcelines are connected together and to a global sourceline.

19. The memory array of claim 18 wherein during programming and erase operations the global sourceline is biased to a voltage greater than 0V.

20. A memory cell comprising:
a drain region and a source region in a body region, the drain and source regions having a channel region therebetween; and
a floating gate extending over the channel region, configured to store charges,
wherein said drain region comprises a first diffusion region in the body region and a second diffusion region in the first diffusion region, the first diffusion region having a lower doping concentration than the second diffusion region, the second diffusion region having a portion overlapped by but insulated from the floating gate for erasing the memory cell, the channel region having a portion closer to the first diffusion region than the source region for programming the memory cell.

21. The memory cell of claim 20 wherein the cell is programmed through channel hot electron injection from said portion of the channel region to the floating gate, and erased through Fowler-Nordheim tunneling of electrons from the floating gate to said portion of the second diffusion region overlapped by the floating gate.

22. The memory cell of claim 20 wherein the first diffusion region separates said portion of the second diffusion region and said portion of the channel region.

23. The memory cell of claim 20 further comprising a tunnel oxide insulating the floating gate from its underlying regions.

24. A non-volatile memory cell comprising:
a drain region and a source region in a body region, the drain and source regions forming a channel region between them, the channel region being implanted with impurities so that an initial threshold voltage of the memory cell is less than 1V;
a floating gate the channel region, the floating gate being insulted from the underlying channel region; and
a second layer polysilicon gate extending over at least a portion of the floating gate, the second layer polysilicon being insulated from the underlying floating gate.

25. The non-volatile memory cell of claim 24 wherein the initial threshold voltage is in the range of 0V to 0.8V.

26. The non-volatile memory cell of claim 24 wherein the cell is an EPROM cell, or a Flash EPROM cell, or an EEPROM cell.

27. The non-volatile memory cell of claim 24 wherein the impurities are halo impurities.

28. The non-volatile memory cell of claim 24 wherein the non-volatile memory cell is erased through the drain region and is programmed through a portion of the channel region closer to the drain region than the source region.

29. The memory cell of claim 1 wherein the tunneling of electrons occurs from the floating gate to a portion of the second diffusion region overlapped by the floating gate.

30. A method of operating a non-volatile memory cell having a drain region and a source region forming a channel region therebetween, and a floating gate extending over but insulated from the channel region, the method comprising:
    biasing the memory cell to induce hot electron injection into the floating gate from a portion of the channel region closer to one of the source and drain regions than the other of the source and drain regions; and
    biasing the memory cell to induce Fowler-Nordheim tunneling of electrons from the floating gate to said one of the source and drain regions.

31. The method of claim 30 wherein a first threshold voltage of the memory cell is increased as a result of said biasing the memory cell to induce hot electron injection, and a second threshold voltage of the memory cell is reduced as a result of said biasing the memory cell to induce Fowler-Nordheim tunneling.

32. The method of claim 30 wherein said source and drain regions are of a first conductivity type, and are formed in a body region of a second conductivity type opposite the first conductivity type, said one of the source and drain regions comprising a first diffusion region and a second diffusion region both of the first conductivity type, the second diffusion region being in the first diffusion region, the first diffusion region having a doping concentration lower than a doping concentration of the second diffusion region.

33. The method of claim 32 wherein the tunneling of electrons occurs from the floating gate to a portion of the second diffusion region overlapped by the floating gate.

34. The method of claim 33 wherein the first diffusion region separates said portion of the second diffusion region and said portion of the channel region.

35. The method of claim 30 wherein an initial threshold voltage of the memory cell is less than 1V.

36. A method of operating an array of a non-volatile memory cells arranged along rows and columns, each memory cell having a gate, a drain, and a source, the gates of the memory cells in each row being connected together to form a wordline, the drains of the memory cells in each column being connected together to form a bitline extending parallel to the columns of cells, and the sources of the memory cells in each row being connected together to form a sourceline extending parallel to the rows of cells, the method comprising:
    programming one or more memory cells by applying a positive voltage to a selected wordline, a positive voltage to a selected bitline, and 0V or greater to a selected source line;
    erasing one or more memory cells by applying a negative voltage to a selected wordline, a positive voltage to selected bitline, and floating all source lines or applying 0V or greater to a selected source line; and
    reading one or more memory cells by applying a positive voltage to a selected wordline, and a ground potential to a selected source line.

37. The method of claim 36 wherein the act of programming one or more memory cells further comprises:
    applying a voltage selected from the range 7V to 10V to a selected wordline;
    applying a voltage selected from the range 4V to 6V to a selected bitline;
    applying a voltage selected from the range 0V to 1V to a selected sourceline;
    applying a voltage selected from the range 0V to −1V to non-selected wordlines;
    floating non-selected bitlines; and
    floating or applying a voltage selected from the range 0V to 1V to non-selected sourcelines.

38. The method of claim 36 wherein the act of erasing one or more memory cells further comprises:
    applying a voltage selected from the range −7V to −10V to a selected wordline;
    applying a voltage selected from the range 3V to 5V to a selected bitline;
    floating or applying a voltage selected from the range 0V to 1V to a selected sourceline;
    applying a voltage selected from the range 0V to −1V to non-selected wordlines;
    floating non-selected bitlines; and
    floating or applying a voltage selected from the range 0V to 1V to non-selected sourcelines.

39. The method of claim 36 wherein the act of erasing one or more memory cells further comprises:
    applying a voltage in the range of 1V to 2.5V to a selected wordline;
    applying a voltage in the range of 0.7V to 1.2V to a selected bitline;
    applying 0V to a selected sourceline;
    applying 0V to non-selected wordlines;
    floating the non-selected bitlines; and
    floating or applying a voltage in the range of 0V to 1V to the non-selected sourcelines.

* * * * *